United States Patent
Lambert et al.

(10) Patent No.: US 10,088,526 B2
(45) Date of Patent: Oct. 2, 2018

(54) TESTER FOR INTEGRATED CIRCUITS ON A SILICON WAFER AND INTEGRATED CIRCUIT

(71) Applicant: STARCHIP, Meyreuil (FR)

(72) Inventors: Cyrille Lambert, Meyreuil (FR);
Sébastien Bayon, Meyreuil (FR);
Alexandre Croguennec, Meyreuil (FR)

(73) Assignee: STARCHIP, Meyreuil (FR)

( * ) Notice: Subject to any disclaimer, the term of this patent is extended or adjusted under 35 U.S.C. 154(b) by 0 days.

(21) Appl. No.: 15/057,662

(22) Filed: Mar. 1, 2016

(65) Prior Publication Data

US 2016/0259002 A1 Sep. 8, 2016

(30) Foreign Application Priority Data

Mar. 6, 2015 (FR) ...................... 15 51904

(51) Int. Cl.
*G01R 31/28* (2006.01)
*G01R 31/3177* (2006.01)
*G01R 31/3185* (2006.01)
*G01R 31/319* (2006.01)
G01R 31/317 (2006.01)

(52) U.S. Cl.
CPC ... *G01R 31/3177* (2013.01); *G01R 31/31908* (2013.01); *G01R 31/318511* (2013.01); *G01R 31/3172* (2013.01)

(58) Field of Classification Search
None
See application file for complete search history.

(56) References Cited

U.S. PATENT DOCUMENTS

| | | | |
|---|---|---|---|
| 9,316,690 B2* | 4/2016 | Zuo ............... | G01B 31/318544 |
| 2004/0054951 A1 | 3/2004 | Ma et al. | |
| 2007/0216438 A1 | 9/2007 | Gupta et al. | |
| 2008/0028269 A1* | 1/2008 | Imming ............ | G01R 31/2834 |
| | | | 714/738 |
| 2010/0100786 A1 | 4/2010 | Dixon et al. | |
| 2012/0124441 A1* | 5/2012 | Teng ...................... | G11C 29/16 |
| | | | 714/735 |
| 2014/0143600 A1* | 5/2014 | Hutner .................. | G06F 11/362 |
| | | | 714/35 |
| 2014/0236525 A1* | 8/2014 | Chan ................ | G01R 31/31907 |
| | | | 702/119 |

OTHER PUBLICATIONS

Jan. 13, 2016 Search Report issued in French Patent Application No. 1551904.

* cited by examiner

*Primary Examiner* — Daniel McMahon
(74) *Attorney, Agent, or Firm* — Oliff PLC; R. Brian Drozd (57) ABSTRACT

A tester for integrated circuits on a silicon wafer includes an input/output connection for testing an integrated circuit. The tester comprises circuitry arranged for transferring a first data frame to the integrated circuit via the input/output connection, the first data frame including a time reference for the data included in the data frame, a field for validating the time reference and a data field including at least one test command and for receiving a second data frame via the input/output connection, the data in the second data frame received having a duration that is a multiple of the time reference.

19 Claims, 6 Drawing Sheets

| Command | Data | Response |
|---|---|---|
| Write a data item | Address for the data<br>Data value | None |
| Read a data item | Address of the data to be read | Value read |
| Adjust analogue voltage | Type of adjustment<br>Programming deletion | None |
| Adjust internal oscillator | Min and max limits and time reference | None |
| Read analogue voltage | Identification of signal and time allocated for reading | Value read |

TESTER FOR INTEGRATED CIRCUITS ON A SILICON WAFER AND INTEGRATED CIRCUIT

FIELD OF THE INVENTION

The present invention relates to a method and device for testing integrated circuits disposed on a silicon wafer.

BACKGROUND OF THE INVENTION

Integrated circuits are manufactured on silicon wafers. A silicon wafer comprises a large number of integrated circuits, typically thousands. The testers used for testing integrated circuits comprise a limited number of input/output connections with the silicon wafer, which cannot be increased.

In order to test all the integrated circuits on a silicon wafer, the tester comes into contact, by means of a probe card, with rectangular regions of the integrated circuit several times in order to establish an electrical connection with the integrated circuit. Several integrated circuits are tested simultaneously in order to reduce the time taken for testing the silicon wafer.

The larger the number of integrated circuits tested in parallel, the shorter the time needed for testing the silicon wafer. The larger the number of test probes used for testing an integrated circuit, the smaller the number of integrated circuits tested in parallel because of the limitation imposed by the number of input/output connections and test probes of the tester.

In addition, integrated circuits on silicon wafers have an internal clock, the frequency of which varies significantly from one integrated circuit to another. The result is a not insignificant difficulty in testing integrated circuits.

The aim of the present invention is to solve the drawbacks of the prior art by proposing a test method and device in which only one input/output connection is necessary for testing an integrated circuit with an internal clock frequency that is not known to the tester.

BRIEF SUMMARY OF THE INVENTION

To this end, according to a first aspect, the invention proposes a tester for integrated circuits present on a silicon wafer, characterised in that the tester comprises an input/output connection for testing an integrated circuit and in that the tester comprises:
  means for transferring a data frame to the integrated circuit via the input/output connection, the data frame comprising a time reference for the data included in the data frame, a field for validating the time reference and a data field comprising at least one integrated-circuit test command,
  means for receiving a data frame via the input/output connection, the data in the data frame received having a duration that is a multiple of the time reference.

The present invention also relates to a method for testing integrated circuits present on a silicon wafer, by means of a tester, the tester comprising an input/output connection for testing an integrated circuit, characterised in that the method comprises the steps of:
  transferring a data frame to the integrated circuit via the input/output connection, the data frame comprising a time reference for the data included in the data frame, a field for validating the time reference and a data field comprising at least one integrated-circuit test command,
  receiving a data frame via the input/output connection, the data in the received data frame having a duration that is a multiple of the time reference.

Thus, by using only one input/output connection in addition to power supply connections to the integrated circuit for testing the integrated circuit, the number of integrated circuits tested in parallel is increased. The time taken for testing the integrated circuits on a silicon wafer is reduced and the cost of producing the integrated circuits is reduced even if the frequency of the internal clock of the integrated circuits is not known to the tester.

By inserting a time reference in the transmitted data frame, the integrated circuits can synchronise themselves with the data received and can process same. It is then no longer necessary to have a connection dedicated to the transmission of a clock common to the integrated circuits and to the tester.

Since the data in the received data frame have a duration that is a multiple of the time reference, the constraints such as the rising and falling edges of the signals transmitted by the integrated circuit are fewer. The characteristics of the electronic elements, for example in terms of capacity for supplying current, may be reduced, just like the size of the electronic elements. The cost of the integrated circuit is thus also reduced.

According to a particular embodiment of the invention, each data item in the data frame transferred to the integrated circuit is represented by a logic high and low level.

Thus the integrated circuit can continue to synchronise during the reception of the data.

According to a particular embodiment of the invention, the data frame transferred to the integrated circuit also comprises a value associated with the integrated-circuit test command.

Thus the tester can vary certain parameters for testing the integrated circuits.

According to a particular embodiment of the invention, the integrated-circuit test command is a command for adjusting an analogue or frequency or digital value in the integrated circuit.

Thus a single input/output connection is used for testing an integrated circuit, and the number of integrated circuits tested in parallel is increased.

According to a particular embodiment of the invention, the command is a command for transmitting or receiving an analogue signal in a time window following the data frame and the tester comprises means for transmitting or receiving the analogue signal in the time window following the data frame.

Thus a single input/output connection is used for testing an integrated circuit, and the number of integrated circuits tested in parallel is increased.

According to a particular embodiment of the invention, the command is a command for adjusting the internal clock of the integrated circuit or a command for adjusting a voltage, for writing or deleting a data item in a memory of the integrated circuit.

Thus all the adjustments necessary for the integrated circuits for functioning in accordance with the criteria of a specification can be made.

The present invention also relates to an integrated circuit characterised in that it comprises an input/output connection for testing the integrated circuit and in that it comprises:

means for receiving a data frame via the input/output connection, the data frame comprising a time reference for the data included in the data frame, a field for validating the time reference and a data field comprising at least one integrated-circuit test command, means for transferring a data frame via the input/output connection, the data in the data frame transferred having a duration that is a multiple of the time reference.

The present invention also relates to a method for testing an integrated circuit comprising an input/output connection for testing the integrated circuit, characterised in that the method comprises the steps performed by the integrated circuit of:

receiving a data frame via the input/output connection, the data frame comprising a time reference for the data included in the data frame, a validation field for the time reference and a data field comprising at least one command for testing the integrated circuit, transferring a data frame via the input/output connection, the data in the data frame transferred having a duration that is a multiple of the time reference.

Thus, by synchronising on the time reference in the data frame transmitted, the integrated circuit can process the data received.

In addition, the maximum number of probes on a probe card being limited by technological capacities, increasing the number of chips tested in parallel reduces the cost of the test. The present invention makes it possible to optimise the use of the probe card to the maximum possible extent.

In addition, the cost of producing the integrated circuits is reduced even if the frequency of the internal clock of the integrated circuits is not known to the tester.

Since the data in the data frame sent have a duration that is a multiple of the time reference, the constraints such as the rising and falling edges of the signals transmitted by the integrated circuit are fewer. The characteristics of the electronic elements, for example in terms of capacity to supply current, can be reduced along with the size of these electronic elements. The cost of the integrated circuit is thus also reduced.

According to a particular embodiment of the invention, the data frame received further comprises a value associated with the command for testing the integrated circuit.

Thus the various values necessary for testing the integrated circuit do not need to be stored therein. The size of the integrated circuit is reduced thereby.

According to a particular embodiment of the invention, the command for testing the integrated circuit is a command for adjusting an analogue or frequency or digital value in the integrated circuit.

Thus a single input/output connection is used for testing an integrated circuit, and the number of integrated circuits tested in parallel is increased.

According to a particular embodiment of the invention, the command is a command for transmitting or receiving an analogue signal in a time window following the data frame and the integrated circuit comprises means for transmitting or receiving the analogue signal in the time window following the data frame.

Thus a single input/output connection is used for testing an integrated circuit, and the number of integrated circuits tested in parallel is increased.

According to a particular embodiment of the invention, the command is a command for adjusting the internal clock of the integrated circuit.

Thus the frequency of the internal clock of the integrated circuit can be adjusted to a value corresponding to a criterion of a specification.

According to a particular embodiment of the invention, the command is a command for adjusting a voltage for writing or deleting a data item in a flash memory of the integrated circuit.

Thus all the adjustments necessary to the integrated circuits for functioning according to the criteria of a specification can be carried out.

According to a particular embodiment of the invention, when the command for adjusting the write or delete voltage is received, the integrated circuit controls reading means in a memory of the integrated circuit by means of a state machine for adjusting the write or delete voltage.

Thus the integrated circuit is able to adjust parameters autonomously without exchanging data with the tester. The testing time is thus reduced.

The invention also relates to the computer programs stored on an information carrier, said programs comprising instructions for implementing the methods previously described, when they are loaded into and executed by a computer system.

BRIEF DESCRIPTION OF SEVERAL VIEWS OF THE DRAWINGS

The features of the invention mentioned above, as well as others, will emerge more clearly from a reading of the following description of an example embodiment, said description being given in relation to the accompanying drawings among which.

DETAILED DESCRIPTION

Figure 1:
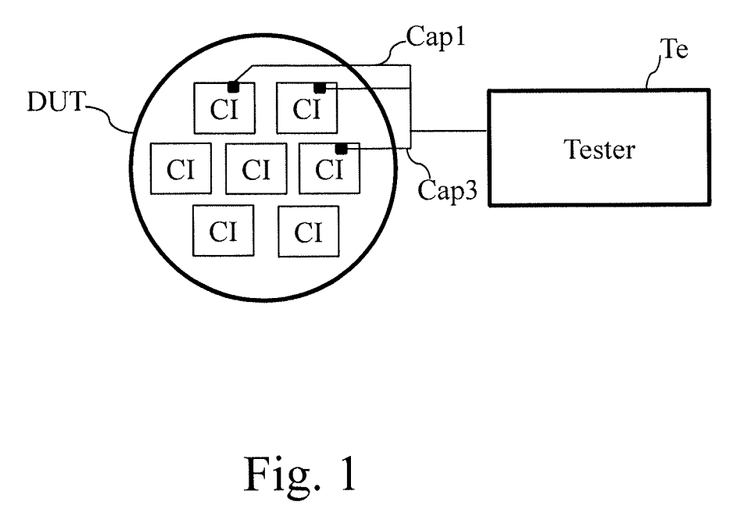
FIG. 1 depicts a system for testing integrated circuits on a silicon wafer.

FIG. 1 depicts a system for testing integrated circuits on a silicon wafer.

In FIG. 1 a tester Te tests the integrated circuits CI of a silicon wafer DUT using a plurality of probe cards coming into contact with the rectangular zones of a group of integrated circuits that are tested in parallel.

The tester Te is for example a computer that controls one or more probe cards. The tester Te tests whether the integrated circuits are in accordance with a specification and enables the parameters of the integrated circuits to be adjusted.

According to the present invention, each integrated circuit has a single contact zone depicted by a black square in FIG.

1, which is used for testing the integrated circuit. A single probe is used by the tester Te for testing an integrated circuit in addition to the power supply probes of the integrated circuits. When a probe is in contact with the contact zone, an input/output connection is achieved in accordance with the present invention.

In FIG. 1, three integrated circuits are tested in parallel by means of a probe card comprising the probes Cap1 to Cap3. Naturally a larger number of integrated circuits are tested in parallel, the example in FIG. 1 being merely a simplification of actual conditions.

Likewise, only seven integrated circuits are shown in FIG. 1 for reasons of simplification. Naturally a greater number of integrated circuits are present on the silicon wafer DUT.

Each integrated circuit has its own internal clock, the frequency of which varies from one integrated circuit to another and is different from that of the tester Te.

The use of a single contact zone according to the present invention is possible by virtue of a protocol for communication between the tester Te, and each integrated circuit CI is tested so that the tester Te can indicate the type of test or adjustment that must be carried out and so that the integrated circuit CI understands this. The same applies to the exchange of information between the integrated circuit CI and the tester Te.

In the testing of an integrated circuit, signals, both digital and analogue, are exchanged between the integrated circuit CI and the tester Te. For example, adjusting parameters of the flash memory of the integrated circuit CI and selecting certain test modes for the flash memory make it possible to measure electrical voltages and/or currents. The use of a single contact zone according to the present invention for testing an integrated circuit CI takes into account this constraint.

According to the present invention, the tester Te comprises:
 means for transferring a data frame to the integrated circuit via the input/output connection, the data frame comprising a time reference for the data included in the data frame, a field for validating the time reference and a data field comprising at least one command for testing the integrated circuit,
 means for receiving a data frame via the input/output connection, the data in the data frame received having a duration that is a multiple of the time reference.

Each integrated circuit comprises:
 means for receiving a data frame via the input/output connection, the data frame comprising a time reference for the data included in the data frame, a field for validating the time reference and a data field comprising at least one command for testing the integrated circuit,
 means for transferring a data frame via the input/output connection, the data in the data frame transferred having a duration that is a multiple of the time reference.

Figure 2:
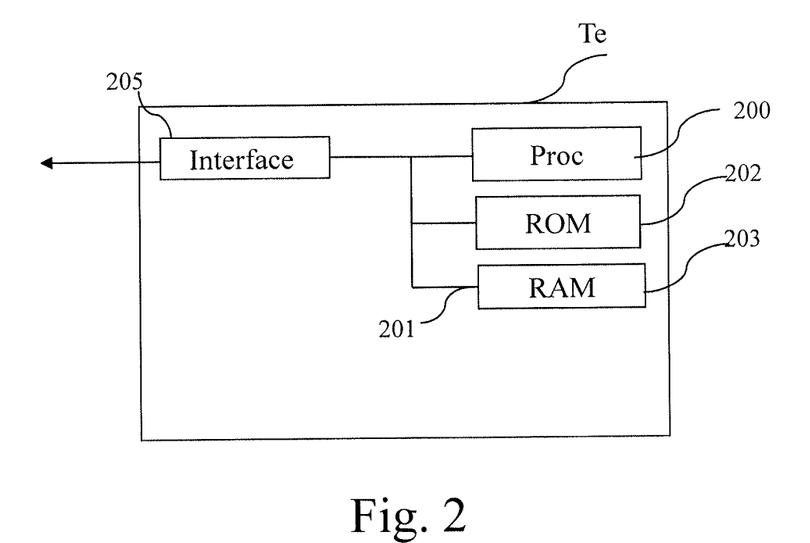
FIG. 2 depicts an architecture of a testing device according to the present invention.

FIG. 2 depicts an architecture of a test device or tester according to the present invention.

The tester Te comprises:
 a processor, microprocessor or microcontroller 200;
 a volatile memory 203;
 a ROM memory 202;
 an interface 205 that comprises at least one probe card;
 a communication bus 201 connecting the processor 200 to the ROM memory 202, to the RAM memory 203 and to the interface 205.

The processor 200 is capable of executing instructions loaded into the volatile memory 203 from the ROM memory 202, from an external memory (not shown) or from a storage medium. When the tester Te is powered up, the processor 200 is capable of reading instructions from the volatile memory 203 and executing them. These instructions form a computer program that causes the processor 200 to implement all or part of the method described in relation to FIG. 7.

Figure 7:
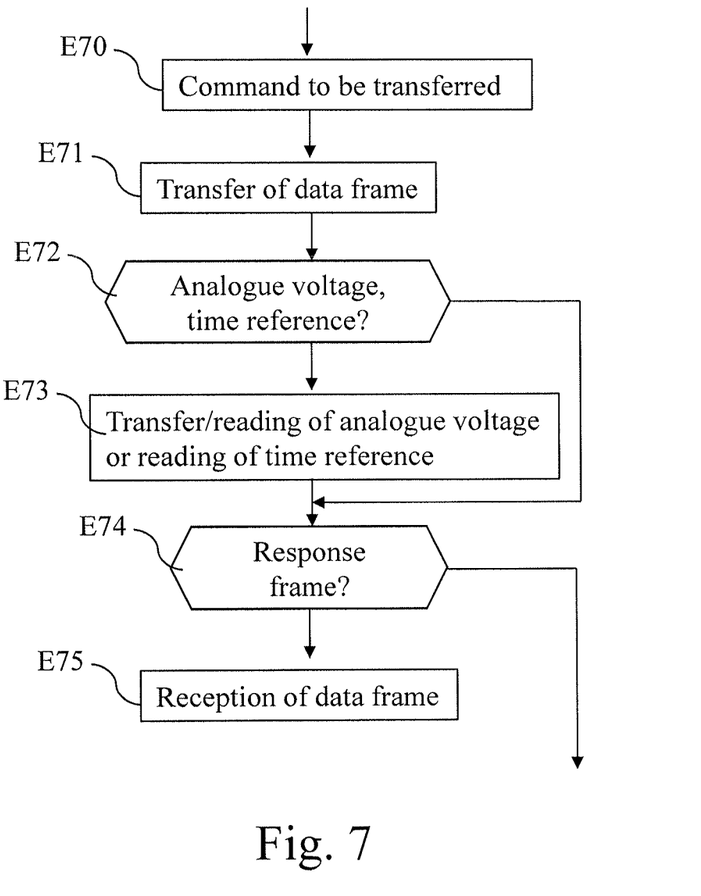
FIG. 7 depicts a test algorithm executed by the tester according to the present invention.

All or part of the method described in relation to FIG. 7 may be implemented in software form by the execution of a set of instructions by a programmable machine such as a DSP (Digital Signal Processor) or a microcontroller or be implemented in hardware form by a machine or a dedicated component such as FPGA (Field Programmable Gate Array) or an ASIC (Application-Specific Integrated Circuit).

Figure 3:
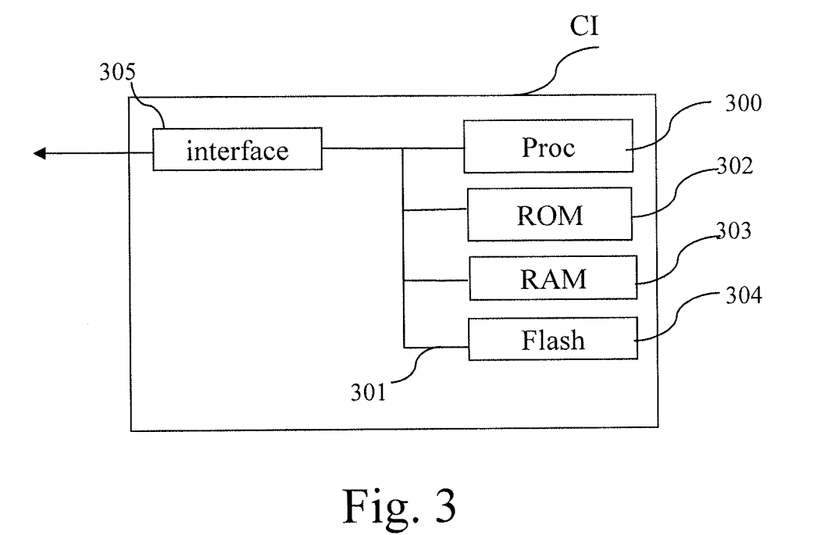
FIG. 3 depicts an architecture of a testing device according to the present invention.

FIG. 3 depicts an integrated circuit architecture on a silicon wafer according to the present invention.

The integrated circuit Te comprises:
 a processor, microprocessor or microcontroller 300;
 a volatile memory 303;
 a ROM memory 302;
 a flash memory 304;
 an interface 305 that comprises a contact zone for contact with a probe of a probe card;
 a communication bus 301 connecting the processor 300 to the ROM memory 302, to the RAM memory 303, to the flash memory 304 and to the interface 305.

The processor 300 is capable of executing instructions loaded into the volatile memory 303 from the ROM memory 302. When the integrated circuit CI is powered up, the processor 300 is capable of reading instructions from the volatile memory 303 and executing them. These instructions form a computer program that causes the processor 300 to implement all or some of the methods described in relation to FIGS. 8 and 9.

Figure 8:
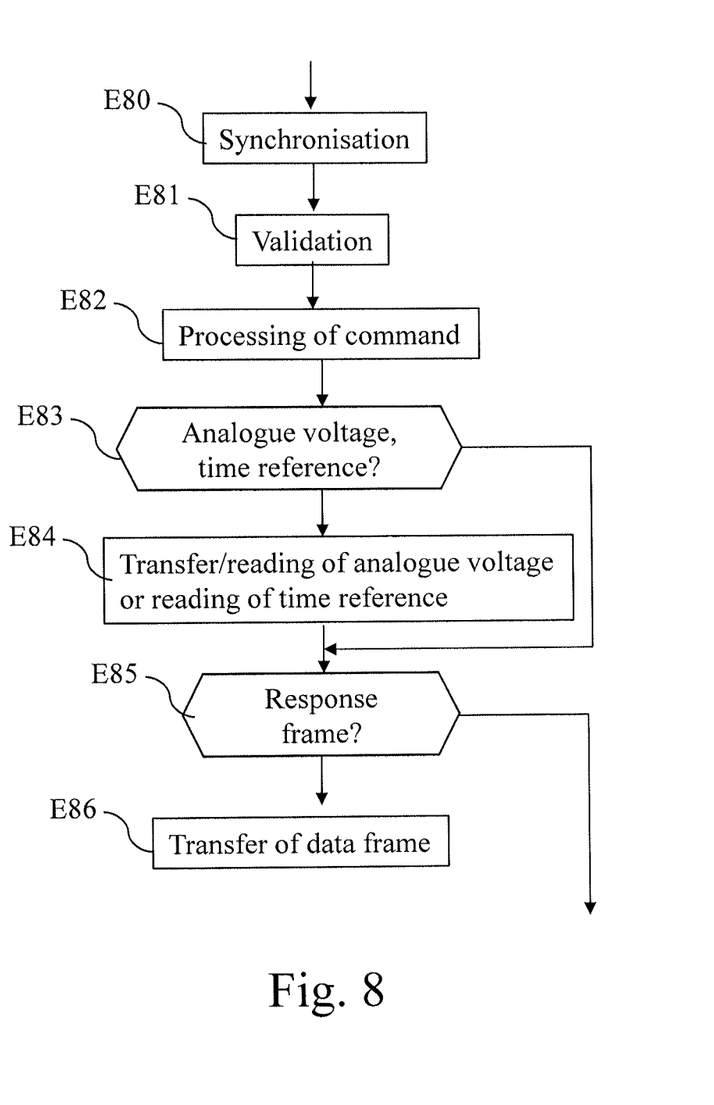
FIG. 8 depicts a test algorithm executed by an integrated circuit according to the present invention.
Figure 9:
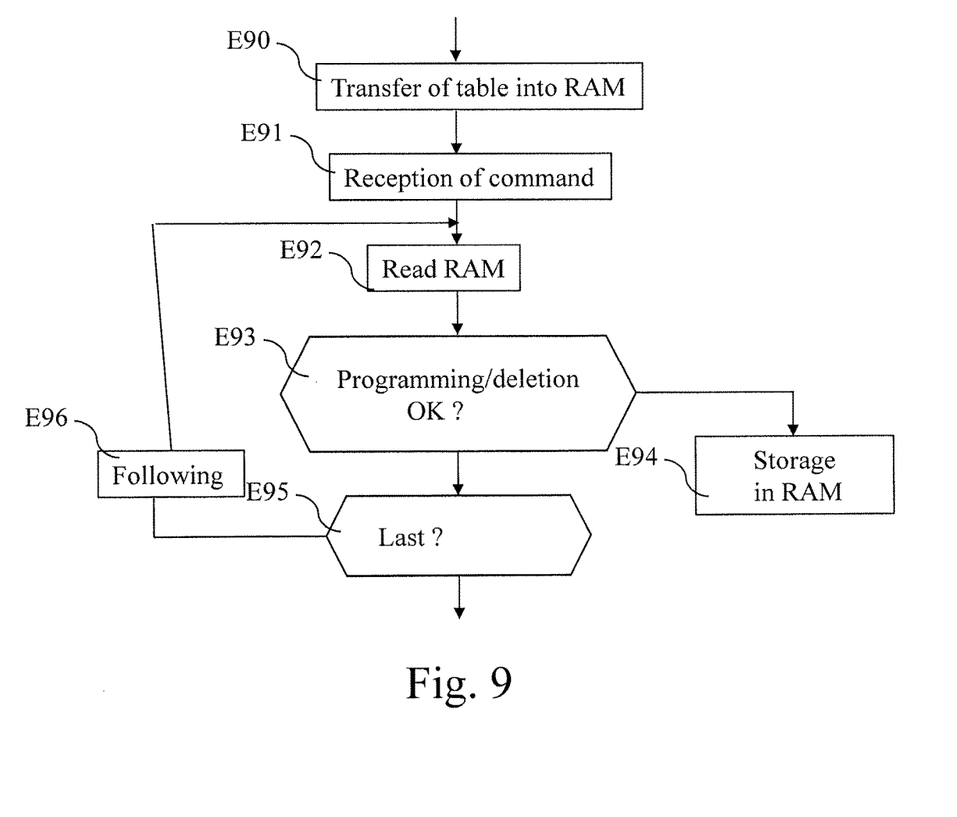
FIG. 9 depicts an algorithm executed by an integrated circuit on reception of a command for adjusting the programming or deletion voltage of a flash memory.

All or some of the methods described in relation to FIGS. 8 and 9 may be implemented in software form by the execution of a set of instructions by a programmable machine such as a DSP (Digital Signal Processor) or a microcontroller or be implemented in hardware form by a machine or a dedicated component.

Figure 4:
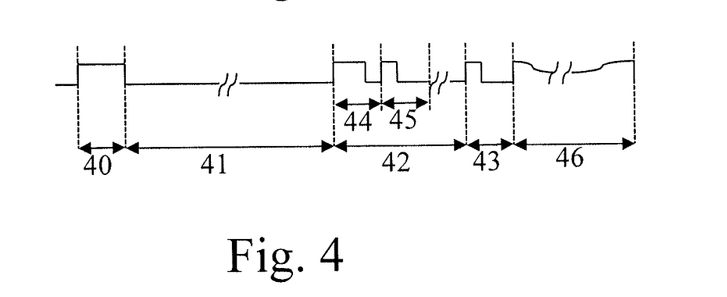
FIG. 4 depicts an example of a data frame sent by the tester intended for integrated circuits.

FIG. 4 depicts an example of a data frame sent by the tester to integrated circuits.

The data frame sent by the tester Te to integrated circuits CI is broken down into a time reference 40, a field for validating the time reference 41, data 42 and an end of frame 43, The tester Te sends commands to the integrated circuits CI and optionally receives responses to the commands sent.

According to the protocol used, self-calibration is carried out at least each start of frame sent by the tester Te. The time reference 40 has a duration determined by the frequency of the tester Te. The reference 40 corresponds for example to a logic high level, the duration of which is for example equal to three clock periods of the clock of the tester Te. This duration of three clock periods will be used by the integrated circuits CI in order to synchronise with the clock of the tester Te.

The field for validating the time reference 41 corresponds to a logic low level, the duration of which is for example equal to a predetermined integer number of times the duration of the time reference 40. For example, the validation field has a duration equal to eight times the duration of the time reference 40.

The field for validating the time reference 41 enables the integrated circuit CI receiving the data frame to check whether or not the time reference actually corresponds to a start of frame. If the field for validating the time reference 41 is not equal to the predetermined number of times the duration of the time reference 40, the time reference 40 is a stray pulse. If the field for validating the time reference 41 is equal to the predetermined number of times the duration of the time reference 40, a frame is actually received.

The data field 42 contains the data necessary for the command sent.

Figure 6:
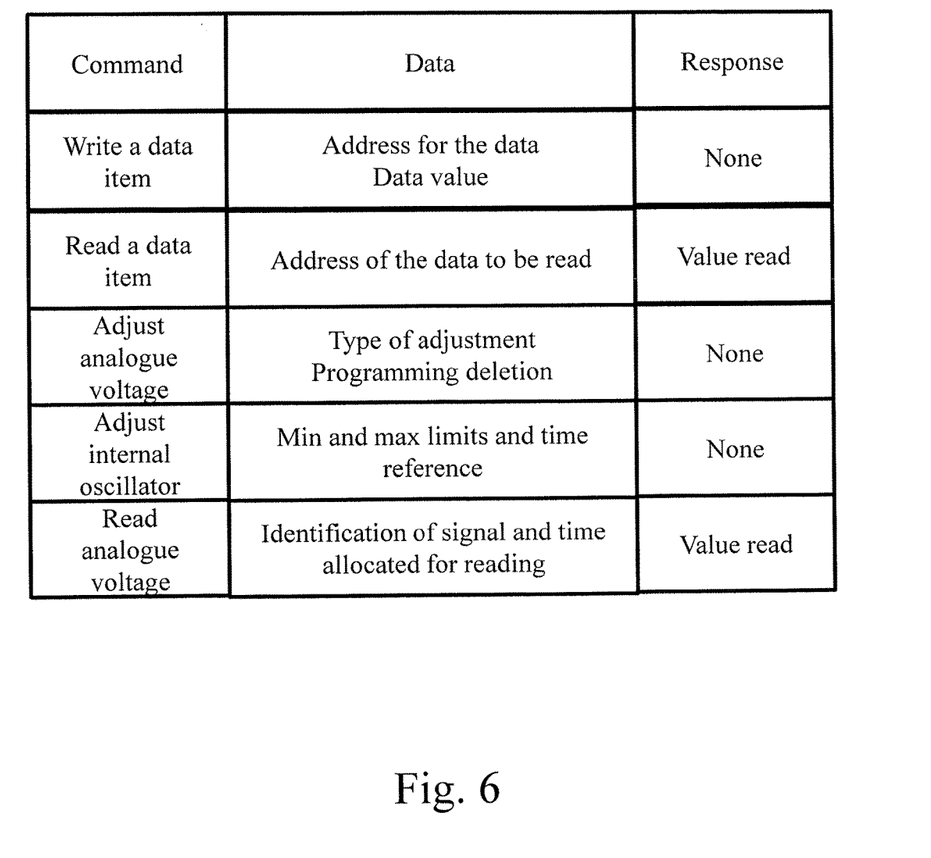
FIG. 6 depicts examples of commands included in a data frame as described with reference to FIG. 4.

Examples of commands are given with reference to FIG. 6.

The data field 42 comprises a succession of binary values "0" or "1".

For example, the binary value "1" in the field 44 corresponds to two clock periods of the clock of the tester Te at the high level followed by a clock period of the clock of the tester Te at the low level.

For example, the binary value "0" in the field 45 corresponds to a clock period of the clock of the tester Te at the high level followed by two clock periods of the clock of the tester Te at the low level.

According to this example, the integrated circuit CI may, during the reception of the data, continue to synchronise on the clock of the tester Te.

In a variant, the binary value "1" corresponds to three clock periods of the clock of the tester Te at the high level and the binary value "0" corresponds to three clock period of the clock of the tester Te at the low level.

The end of frame 43 corresponds to two clock periods of the clock of the tester Te at the high level followed by a clock period of the clock of the tester Te at the low level.

After the end of frame 43, during a period denoted 46, an analogue voltage may optionally be transmitted or received. This analogue voltage is delivered by the integrated circuit CI or by the tester Te. This analogue voltage is for example a voltage supplied by the tester Te by means of a command present in the data field or a voltage requested by the tester Te by means of a command present in the data field.

The period 46 may also be a time reference.

Figure 5:
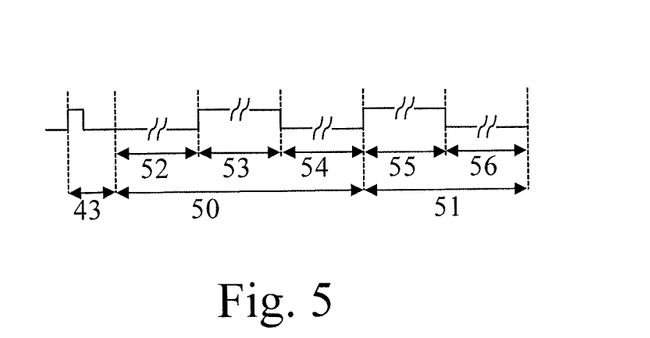
FIG. 5 depicts an example of a data frame send by an integrated circuit intended for the tester.

FIG. 5 depicts an example of a data frame sent by an integrated circuit to the tester.

As soon as an end of frame 43 is received, the integrated circuit CI responds if necessary to the frame as described with reference to FIG. 4.

FIG. 5 depicts an end of frame 43 for a digital response of the frame as described with reference FIG. 4, a start of frame 50 and a data field 51.

The frame comprises a start of frame 50. The start of frame 50 comprises three binary values 52 to 54.

The clock used by the integrated circuit CI is an integer number of times the duration of the boot field 40 of the frame as described with reference to FIG. 4 and greater than or equal to twice the duration of the boot field 40.

For example, the number of times is a multiple of two, preferentially equal to eight.

This is because, since the integrated circuit CI has to have a silicon surface that is as small as possible, the output stage delivering the data frames to the tester Te has specifications in terms of current supply that are much lower than the output state of the tester Te. By using a multiple of the duration of the boot field 40, any problems related to the limitations related to the output current are solved. In addition, because of the disparity in the internal frequencies of the integrated circuits, the duration of an item of binary information for the frame transfer of the integrated circuit CI is chosen so that all the functional integrated circuits can respond at an appropriate rate.

The binary value 52 is at the low level "0" and has a duration of eight times the duration of the boot field 40.

The binary value 52 is at the high level "1" and has a duration of eight times the duration of the boot field 40.

The binary value 53 is at the low level "0" and has a duration of eight times the duration of the boot field 40.

The data field 51 comprises one or more binary values.

In the example in FIG. 5, the data field comprises two binary values 55 and 56.

The binary value 55 is at the low level "0" and has a duration of eight times the duration of the boot field 40.

The binary value 56 is at the high level "1" and has a duration of eight times the duration of the boot field 40.

The frame sent by the integrated circuit CI does not include an end of frame delimiter. This is not useful since the tester Te knows whether or not a response is necessary and, if so, the number of bits.

FIG. 6 depicts examples of commands included in a frame as described with reference to FIG. 4.

The table in FIG. 6 comprises three columns, a first column indicates the type of command. The type of command, in the form of a predetermined binary word, is included in the data field 42 of the frame as described with reference to FIG. 4.

The second column indicates the data that are included in the data field 42.

The third column indicates whether or not a response as described with reference to FIG. 5 or during a period denoted 46 in FIG. 6 must be transmitted by the integrated circuit CI. This response is, according to the type of command, digital, analogue or frequency.

For a data-write command, the data field 42 comprises the address at which the data item is to be written as well as the value of the data item. No frame is to be transmitted in response.

For a data-read command, the data field 42 comprises the address at which the data item must be read and returned in the data field 51 of FIG. 5.

A frame as received with reference to FIG. 5 must be transmitted in response. The field 41 of the frame comprises the value of the data item read.

For an analogue voltage adjustment command, the data field 42 comprises the type of adjustment to be made, such as for example a programming or deletion voltage. No frame is to be transmitted in response.

Prior to the analogue voltage adjustment command, a table of parameters is written in a predetermined area of a memory of the integrated circuit. The memory is for example a RAM memory.

For a command for adjustment of the internal oscillator of the integrated circuit, the data field 42 comprises the range of values in which the frequency of the internal oscillator of the integrated circuit is to be adjusted. A time reference is inserted in the field 46 in FIG. 4. No frame is to be transmitted in response.

The integrated circuit CI, when the command for adjusting the internal oscillator is received, counts the number of pulses produced by the internal oscillator during the time reference indicated by the duration of the field 46. If the number of pulses counted is not included in the value range, the frequency of the internal oscillator is modified until the number of pulses counted is included in the value range.

For a command to read an analogue voltage, the data field 42 comprises information indicating which analogue signal the tester Te will insert in the field 46 of FIG. 4 as well as the duration of the field 46.

FIG. 7 depicts a test algorithm executed by the tester according to the present invention.

More precisely, the present algorithm is executed by the processor 200 of the tester Te.

At step E70 the processor 200 selects a command to be sent to at least one integrated circuit CI from a list of commands corresponding to tests or adjustments of the parameters of the integrated circuits CI.

At the following step E71, the processor 200 commands the transfer of the data frame as described with reference to FIG. 4 and which comprises the command selected.

At the following step E72, the processor 200 checks whether, for the command, an analogue voltage must be transmitted or received or a reference time is included in the field 46 of FIG. 4.

If so, the processor 200 moves to step E73 and transfers or reads the analogue voltage or the reference time during the period denoted 46 in FIG. 4. If not, the processor 200 moves to step E74.

At step E74, the processor 200 checks whether a frame is to be received in response to the frame transmitted at step E71.

If a frame is to be received in response to the frame transmitted at step E71, the processor 200 moves to step E75. If not, the processor 200 interrupts the present algorithm, At step E75, the processor 200 receives, by means of the interface 205, the data frame as described with reference to FIG. 5.

Once this operation has been performed, the processor 200 interrupts the present algorithm.

FIG. 8 depicts a test algorithm executed by an integrated circuit according to the present invention.

More precisely, the present algorithm is executed by the processor 300 of each integrated circuit CI.

At step E80, the processor 300 receives a data frame as described with reference to FIG. 4. At this step, the processor 300 synchronises on the time reference 40.

At step E81, the processor 300 validates the time reference by checking whether the validation field for the time reference 41 is equal to a predetermined number of times the time reference 40. If not, the processor 300 interrupts the present algorithm while awaiting a new time reference 40.

At step E82, the processor 300 processes the data included in the data field 42 and executes the command.

At the following step E83, the processor 300 checks whether, for the command, an analogue voltage or a time reference is to be transmitted or received or transmitted and received.

If so, the processor 300 moves to step E84 and transfers or reads an analogue voltage or measures the time reference during the period denoted 46 in FIG. 4. If not, the processor 300 moves to step E85.

At step E85, the processor 300 checks whether a data frame is to be transmitted in response to the data frame received at step E80.

If a data frame is to be transmitted, the processor 300 moves to step E86. If not, the processor 300 interrupts the present algorithm.

At step E86, the processor 300 transfers, by means of the interface 305, the data frame as described with reference to FIG. 5.

Once this operation has been performed, the processor 300 interrupts the present algorithm.

FIG. 9 depicts an algorithm executed by an integrated circuit on reception of a command to adjust the programming voltage or to erase a flash memory.

More precisely, the present algorithm or state machine is executed by the processor 300 of each integrated circuit CI.

At step E91, the processor 300 commands the transfer of a table including various voltage values in the random access memory RAM.

At the following step E91, the processor 300 detects the reception of a command to adjust the programming voltage or to erase a memory. The memory is for example a flash or E2PROM or MRAM or MLU or CBRAM or FeRAM memory.

At the following step E92, the processor 300 reads a voltage value in the random access memory and applies the voltage read to the memory.

At the following step E93, the processor 300 checks whether an erasure or a programming has been done correctly.

If so, the processor 300 moves to step E94 and stores the value read in the random access memory RAM.

If not, the processor 300 moves to step E95 and checks whether all the values included in the table have been read.

If all the values included in the table have been read, the present algorithm is interrupted. If not, the processor 300 moves to step E96, reads another voltage value in the random access memory and applies the read voltage to the flash memory.

Once this operation has been performed, the processor 300 returns to step E93.

The invention claimed is:

1. A tester for integrated circuits on a silicon wafer, wherein the tester comprises:
   a single input/output connection for testing an integrated circuit; and
   circuitry causing the tester to perform:
      transferring a first data frame to the integrated circuit via the input/output connection, the first data frame comprising (1) a field that is a time reference for data included in the first data frame, (2) a field for validating the time reference being a multiple of a duration of the field that is a time reference, and (3) a data field comprising at least one test command; and
      receiving, from an integrated circuit on the silicon wafer, a second data frame via the input/output connection, data in the second data frame being received within a duration equal to an integer number that is a multiple of the time reference and greater than or equal to twice the time reference.

2. The tester according to claim 1, wherein the data in the second data frame is received within a duration equal to an integer number that is a multiple of twice of the time reference.

3. The tester according to claim 1, wherein each data in the first data frame transferred to the integrated circuit is represented by a logic high and low level.

4. The tester according to claim 1, wherein the data frame transferred to the integrated circuit further comprises a value associated with the at least one test command to test the integrated circuit.

5. The tester according to claim 1, wherein the at least one test command to test the integrated circuit is for adjusting an analogue value, a frequency value, or a digital value in the integrated circuit.

6. The tester according to claim 5, wherein the at least one test command is to transmit or receive an analogue signal in a time window following the first data frame and the tester comprises circuitry causing the tester to perform transmitting or receiving the analogue signal in the time window following the data frame.

7. The tester according to claim 5, wherein the at least one test command is for adjusting an internal clock of the integrated circuit or for adjusting a voltage for writing or deleting a data item in a memory of the integrated circuit.

8. An integrated circuit comprising:
an input/output connection for testing the integrated circuit; and
circuitry causing the integrated circuit to perform:
receiving a first data frame via the input/output connection, the first data frame comprising (1) a field that is a time reference for data included in the first data frame, (2) a field for validating the time reference being a multiple of a duration of the field that is a time reference, and (3) a data field comprising at least one test command; and
transferring a second data frame via the input/output connection, data in the second data frame being transferred within a duration equal to an integer number that is a multiple of the time reference and greater than or equal to twice the time reference.

9. The integrated circuit according to claim 8, wherein the data of the first data frame is received within a duration equal to an integer number that is a multiple of twice the time reference.

10. The integrated circuit according to claim 8, wherein the first data frame further comprises a value associated with the at least one test command to test the integrated circuit.

11. The integrated circuit according to claim 10, wherein the at least one test command is to adjust an analogue value, a frequency value, or a digital value in the integrated circuit.

12. The integrated circuit according to claim 10, wherein the at least one test command is to transmit or receive an analogue signal in a time window following the first data frame and the integrated circuit comprises circuitry causing the integrated circuit to perform transmitting or receiving the analogue signal in the time window following the first data frame.

13. The integrated circuit according to claim 10, wherein the at least one test command is for adjusting an internal clock of the integrated circuit.

14. The integrated circuit according to claim 10, wherein the at least one test command is for adjusting a voltage for writing or deleting a data in a memory of the integrated circuit.

15. The integrated circuit according to claim 12, wherein, when the at least one test command is used for adjusting a write or delete voltage is received, the integrated circuit controls reading means in a memory of the integrated circuit by means of a state machine for adjusting the write or delete voltage.

16. A test method, using a tester of integrated circuits on a silicon wafer, the tester comprising a single input/output connection for testing an integrated circuit, wherein said method causes the tester to perform:
transferring a first data frame to the integrated circuit via the input/output connection, the first data frame comprising (1) a field that is a time reference for data included in the first data frame, (2) a field for validating the time reference being a multiple of a duration of the field that is a time reference, and (3) a data field comprising at least one test command; and
receiving a second data frame via the input/output connection, data in the second data frame is received within a duration equal to an integer number that is a multiple of the time reference and greater than or equal to twice time reference.

17. The method according to claim 16, wherein the data in the second data frame is received within a duration equal to an integer number that is a multiple of twice the time reference.

18. A method for testing an integrated circuit comprising a single input/output connection for testing the integrated circuit, wherein said method comprises:
receiving, by the integrated circuit, a first data frame via the input/output connection, the first data frame comprising (1) a field that is a time reference for data included in the first data frame, (2) a field for validating the time reference being a multiple of a duration of the field that is a time reference, and (3) a data field comprising at least one test command,
transferring, by the integrated circuit, a second data frame via the input/output connection, data in the second data frame being transferred within a duration equal to an integer number that is a multiple of twice the time reference.

19. The method according to claim 18, wherein the data in the second data frame is received within a duration equal to an integer number that is a multiple of the time reference.

* * * * *